United States Patent
Komori et al.

(10) Patent No.: US 12,129,543 B2
(45) Date of Patent: Oct. 29, 2024

(54) EPITAXIAL GROWTH APPARATUS AND METHOD OF PRODUCING EPITAXIAL WAFER

(71) Applicant: SUMCO CORPORATION, Tokyo (JP)

(72) Inventors: Haku Komori, Tokyo (JP); Kazuhiro Narahara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 427 days.

(21) Appl. No.: 17/622,458

(22) PCT Filed: May 13, 2020

(86) PCT No.: PCT/JP2020/019162
§ 371 (c)(1),
(2) Date: Dec. 23, 2021

(87) PCT Pub. No.: WO2020/261789
PCT Pub. Date: Dec. 30, 2020

(65) Prior Publication Data
US 2022/0251726 A1 Aug. 11, 2022

(30) Foreign Application Priority Data
Jun. 27, 2019 (JP) .................................. 2019-120088

(51) Int. Cl.
*C30B 25/08* (2006.01)
*C23C 16/24* (2006.01)
(Continued)

(52) U.S. Cl.
CPC .......... *C23C 16/4401* (2013.01); *C23C 16/24* (2013.01); *C30B 25/08* (2013.01);
(Continued)

(58) Field of Classification Search
CPC .................................................. C23C 16/4401
See application file for complete search history.

(56) References Cited

U.S. PATENT DOCUMENTS 5,820,686 A * 10/1998 Moore .................... C30B 25/14
118/728
2002/0033232 A1* 3/2002 Raaijmakers ....... C23C 16/4585
118/723 R
(Continued)

FOREIGN PATENT DOCUMENTS

CN 109003914 A 12/2018
JP 2004134625 A * 4/2004
(Continued)

OTHER PUBLICATIONS

Office Action issued in Taiwanese Patent Appl. No. 11020578770, dated Jun. 22, 2021, along with an English translation thereof.
(Continued)

*Primary Examiner* — Peter Bradford
(74) *Attorney, Agent, or Firm* — GREENBLUM & BERNSTEIN P.L.C.

(57) ABSTRACT

Provided is an epitaxial growth apparatus which makes it possible to prevent the production of debris between a preheat ring and a lower liner without fracturing the preheat ring. The epitaxial growth apparatus includes: a chamber; an upper liner and a lower liner that are disposed on an inner wall of the chamber; a susceptor being provided inside the chamber; and a preheat ring that is disposed on a supporting portion protruding in an opening of the lower liner and is disposed on the outer circumference of the susceptor. The preheat ring is not supported by the supporting portion in at least a part of a region that is right above a region where the semiconductor wafer passes in a transfer path in which the semiconductor wafer is loaded into the chamber to be set on the susceptor.

12 Claims, 8 Drawing Sheets

(51) Int. Cl.
  *C23C 16/44* (2006.01)
  *C30B 25/10* (2006.01)
  *C30B 29/06* (2006.01)
  *H01L 21/02* (2006.01)

(52) U.S. Cl.
  CPC .............. *C30B 25/10* (2013.01); *C30B 29/06* (2013.01); *H01L 21/02008* (2013.01)

(56) References Cited

U.S. PATENT DOCUMENTS

| | | |
|---|---|---|
| 2008/0092821 A1 | 4/2008 | Otsuka |
| 2012/0103263 A1 | 5/2012 | Myo et al. |
| 2012/0263875 A1 | 10/2012 | Brenninger et al. |
| 2014/0116340 A1* | 5/2014 | Mori ........................ C23C 16/46 118/725 |
| 2014/0137801 A1* | 5/2014 | Lau ......................... C30B 25/14 118/728 |

FOREIGN PATENT DOCUMENTS

| | | |
|---|---|---|
| JP | 2006-066432 A | 3/2006 |
| JP | 2012-227527 A | 11/2012 |
| JP | 2014-086688 A | 5/2014 |
| TW | 201842221 A | 12/2018 |
| WO | 2015/076487 A1 | 5/2015 |

OTHER PUBLICATIONS

International Search Report issued in International Pat. Appl. No. PCT/JP2020/019162, dated Nov. 8, 2020, along with an English translation thereof.
Office Action dated Sep. 16, 2023 issued in Chinese Patent Application No. 202080046677.2, along with corresponding English translation.
Office Action dated Sep. 25, 2023 issued in Korean Patent Application No. 10-2021-7042205, along with corresponding English translation.
International preliminary report on patentability dated Dec. 28, 2021 issued in international patent application No. PCT/JP2020/019162, along with an English translation.
Office Action dated Mar. 29, 2022 issued in Japanese patent application No. 2019-120088 along with an English translation.
Chinese Office Action dated May 7, 2023 issued in Chinese patent application No. 202080046677.2 along with corresponding English translation.
German Office Action dated Feb. 16, 2024 issued in German patent application No. 11 2020 003 093.8, along with corresponding English translation.

* cited by examiner

EPITAXIAL GROWTH APPARATUS AND METHOD OF PRODUCING EPITAXIAL WAFER

TECHNICAL FIELD

This disclosure relates to an epitaxial growth apparatus and a method of producing an epitaxial wafer.

BACKGROUND

Epitaxial silicon wafers obtained by forming a silicon epitaxial layer on a silicon wafer, which is a typical semiconductor wafer, have been used as substrates for fabricating various semiconductor devices such as metal-oxide-semiconductor field-effect transistors (MOSFETs) and Dynamic random-access memories (DRAMs).

FIG. 1 illustrates an example of a single-wafer processing epitaxial growth apparatus with which an epitaxial layer is vapor-deposited on a surface of a semiconductor wafer. An epitaxial growth apparatus 100 depicted in this diagram has a process chamber 10 having an upper dome 11, a lower dome 12, and a dome mounting member 13. The upper dome 11 and the lower dome 12 are made of transparent quartz, and are attached to the dome mounting member 13 with a clamp 14.

An upper liner 15 and a lower liner 16 that have a ring shape and are made of quarts are disposed on the inner wall of the process chamber 10 to protect the dome mounting member 13. A gas inlet 17 for supplying reactant gas etc. into the process chamber 10 and a gas outlet 18 for discharging unreacted gas etc. are provided between the upper liner 15 and the lower liner 16 on opposite positions in the process chamber 10.

Further, a susceptor 4 on which a semiconductor wafer W is to be set is provided inside the process chamber 10. The outer circumference of the lower surface of the susceptor 4 is fitted to and supported by susceptor supporting arms 7b connected to a main column 7a of a rotatable supporting shaft 7, and the susceptor 4 is rotated along with the susceptor supporting arms 7b. A base material of the susceptor 4 is carbon graphite, the surface of which is coated with silicon carbide (SiC), and a counter bore for accommodating the semiconductor wafer W is formed on the surface.

Through holes are formed in the susceptor 4 and the supporting arms 7b, and lift pins 5 for supporting the back surface of the semiconductor wafer W and elevating the wafer are inserted in the respective through holes. The lift pins 5 are raised and lowered by vertically moving elevating shafts 6, with the base ends of the lift pins being supported by the elevating shafts 6.

A ring-shaped preheat ring 60 is disposed on the outer circumference of the susceptor 4. The preheat ring 60 preheats reactant gas supplied from the gas inlet 17 to the surface of the semiconductor wafer W set on the susceptor 4. A base material of the preheat ring 60 is carbon graphite, the surface of which is coated with SiC, and the preheat ring 60 is supported by a supporting portion 16a protruding in the opening of the lower liner 16.

FIG. 2 illustrates the surroundings of a wafer loading port in the epitaxial growth apparatus 100 depicted in FIG. 1. The wafer loading port is provided in a position deviated by approximately 90° in the circumferential direction from the positions where the gas inlet 17 and the gas outlet 18 are provided when the epitaxial growth apparatus 100 depicted in FIG. 1 is viewed from above.

As illustrated in FIG. 2, a transfer chamber 20 for transferring the semiconductor wafer W into the process chamber 10 is provided to be adjacent to the process chamber 10 of the epitaxial growth apparatus 100. The transfer chamber 20 and the chamber 10 are communicated via a slit member 21 having a generally rectangular parallelepiped shape.

A communication path 22 allowing for the communication between the interior of the transfer chamber 20 and the interior of the process chamber 10 is defined in the slit member 21. Further, a slit valve 23 for closing the process chamber 10 is provided on the slit member 21 on the transfer chamber 20 side.

The semiconductor wafer W is set on the susceptor 4 in the following manner. First, the susceptor 4 is lowered by the supporting shaft 7. Next, after the slit valve 23 inside the transfer chamber 20 is opened, the semiconductor wafer W placed on a transfer blade B is passed through the communication path 22, loaded into the process chamber 10 through the wafer loading port 24, and set on the susceptor 4.

Subsequently, the lift pins 5 are raised by the elevating shafts 6 to support the back surface of the semiconductor wafer W. After that, the transfer blade B is retracted from the process chamber 10, and the slit valve 23 is closed. Further, the susceptor 4 is raised by the supporting shaft 7, the semiconductor wafer W is set on the susceptor 4, the susceptor 4 is raised to a predetermined height position, and a reactant gas is introduced through the gas inlet port 17 to grow an epitaxial layer on the surface of the semiconductor wafer W.

When the growth of the epitaxial layer ends and the epitaxial wafer obtained is unloaded from the process chamber 10, the above procedure is performed in the reverse order.

As described above, the preheat ring 60 is supported by the supporting portion 16a protruding from the lower liner 16; however, the preheat ring 60 and the lower liner 16 are made of different materials. Accordingly, when the temperature inside the chamber 10 is increased or decreased, friction may be produced due to the difference in the coefficient of thermal expansion between the preheat ring 60 and the supporting portion 16a of the lower liner 16, which would result in the production of debris of those members, and particles would be deposited on the surface of the semiconductor wafer W.

As semiconductor devices have been increasingly miniaturized and integrated in recent years, reduction of crystal defects and particles attached to the wafer surface has been demanded. Accordingly, production of the debris between the preheat ring 60 and the lower liner 16 as described above are necessarily reduced.

This being the situation, WO 2015/076487 A (PTL 1) discloses a technique of preventing the production of debris between a preheat ring and a lower liner when the temperature inside a chamber is increased or decreased, by providing a protrusion under the preheat ring and fixing the preheat ring to the lower liner.

CITATION LIST

Patent Literature

PTL 1: WO 2015/076487 A

SUMMARY

Technical Problem

However, in the technique disclosed in PTL 1, when the temperature inside the chamber is increased or decreased, load caused due to the difference in coefficient of thermal expansion between the preheat ring and the lower liner is applied, and the preheat ring would be fractured.

To address this problem, it could be helpful to provide an epitaxial growth apparatus which makes it possible to prevent the production of debris between a preheat ring and a lower liner without fracturing the preheat ring.

Solution to Problem

We propose the following features to solve the above problem.

[1] An epitaxial growth apparatus used to vapor deposit an epitaxial layer on a surface of a semiconductor wafer, the epitaxial growth apparatus comprising:
a chamber;
an upper liner and a lower liner that have a ring shape and are disposed on an inner wall of the chamber;
a susceptor on which the semiconductor wafer is to be set, the susceptor being provided inside the chamber; and
a preheat ring that is disposed on a supporting portion protruding in an opening of the lower liner and is disposed on an outer circumference of the susceptor,
wherein the semiconductor wafer is loaded into the chamber through a wafer loading port provided on the chamber with the susceptor being lowered, and is set on the susceptor after being passed below the supporting portion of the lower liner and the preheat ring, and
the preheat ring is not supported by the supporting portion in at least a part of a region that is right above a region where the semiconductor wafer passes in a transfer path in which the semiconductor wafer is loaded into the chamber to be set on the susceptor.

[2] The epitaxial growth apparatus according to [1] above, wherein the supporting portion is not provided in the at least a part of the region.

[3] The epitaxial growth apparatus according to [1] above, wherein a gap is provided between the preheat ring and the supporting portion in the at least a part of the region.

[4] The epitaxial growth apparatus according to any one of [1] to [3] above, wherein the at least a part of the region is a region in an entire circumference of the supporting portion that corresponds to a central angle of 10° to 90° with respect to a direction in which the semiconductor wafer is transferred when the epitaxial growth apparatus is viewed from above.

[5] The epitaxial growth apparatus according to any one of [1] to [4] above, wherein the at least a part of the region is the entire region.

[6] A method of producing an epitaxial wafer, wherein a reactant gas is supplied to the epitaxial growth apparatus according to any one of [1] to [5] above to grow an epitaxial layer on a semiconductor wafer, thereby obtaining an epitaxial wafer.

[7] The method of producing an epitaxial wafer, according to [6] above, wherein the semiconductor wafer is a silicon wafer.

Advantageous Effect

With the above features, the production of debris between a preheat ring and a lower liner can be prevented without fracturing the preheat ring.

BRIEF DESCRIPTION OF THE DRAWINGS

In the accompanying drawings,
FIGS. 3A and 3B are schematic views of the structure of a part of a conventional epitaxial growth apparatus around a preheat ring, in which
FIG. 3A is a cross-sectional view taken along the wafer transferring direction,
and FIG. 3B is a top view;
FIGS. 4A and 4B are schematic views of an example of the structure of a part of an epitaxial growth apparatus according to this disclosure around a preheat ring, in which
FIG. 4A is a cross-sectional view taken along the wafer transferring direction,
and FIG. 4B is a top view.

DETAILED DESCRIPTION (Epitaxial Growth Apparatus)

An epitaxial growth apparatus according to this disclosure will now be described with reference to the drawings. An epitaxial growth apparatus according to this disclosure is an epitaxial growth apparatus used to vapor deposit an epitaxial layer on a surface of a semiconductor wafer, and includes a chamber; an upper liner and a lower liner that have a ring shape and are disposed on an inner wall of the chamber; a susceptor on which the semiconductor wafer is to be set, the susceptor being provided inside the chamber; and a preheat ring that is disposed on a supporting portion protruding in an opening of the lower liner and is disposed on the outer circumference of the susceptor. The semiconductor wafer is loaded into the chamber through a wafer loading port provided on the chamber with the susceptor being lowered, and the semiconductor wafer is set on the susceptor after being passed below the supporting portion of the lower liner and the preheat ring. The preheat ring is not supported by the supporting portion in at least a part of a region that is right above a region where the semiconductor wafer passes in a transfer path in which the semiconductor wafer W is loaded into the chamber to be set on the susceptor.

Figure 1:
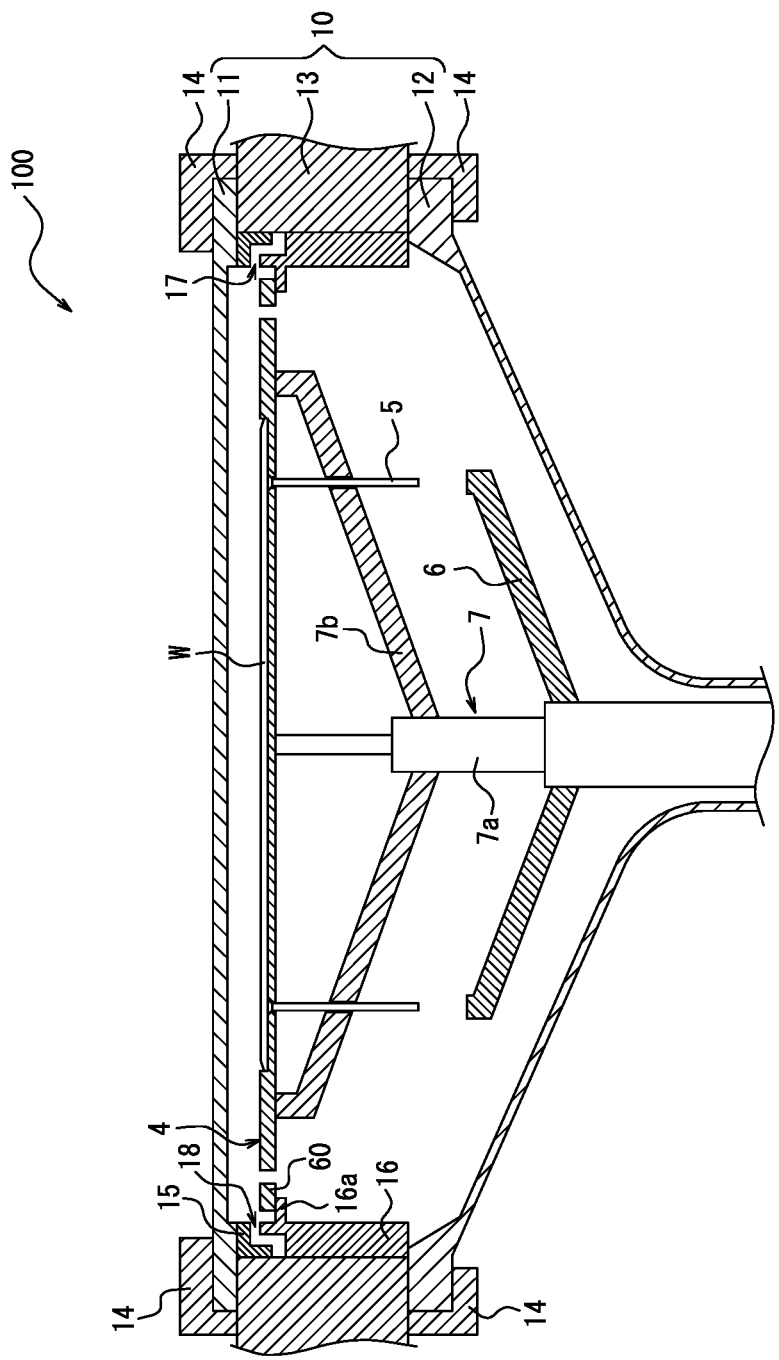
FIG. 1 is a schematic view illustrating an example of an epitaxial growth device.
Figure 2:
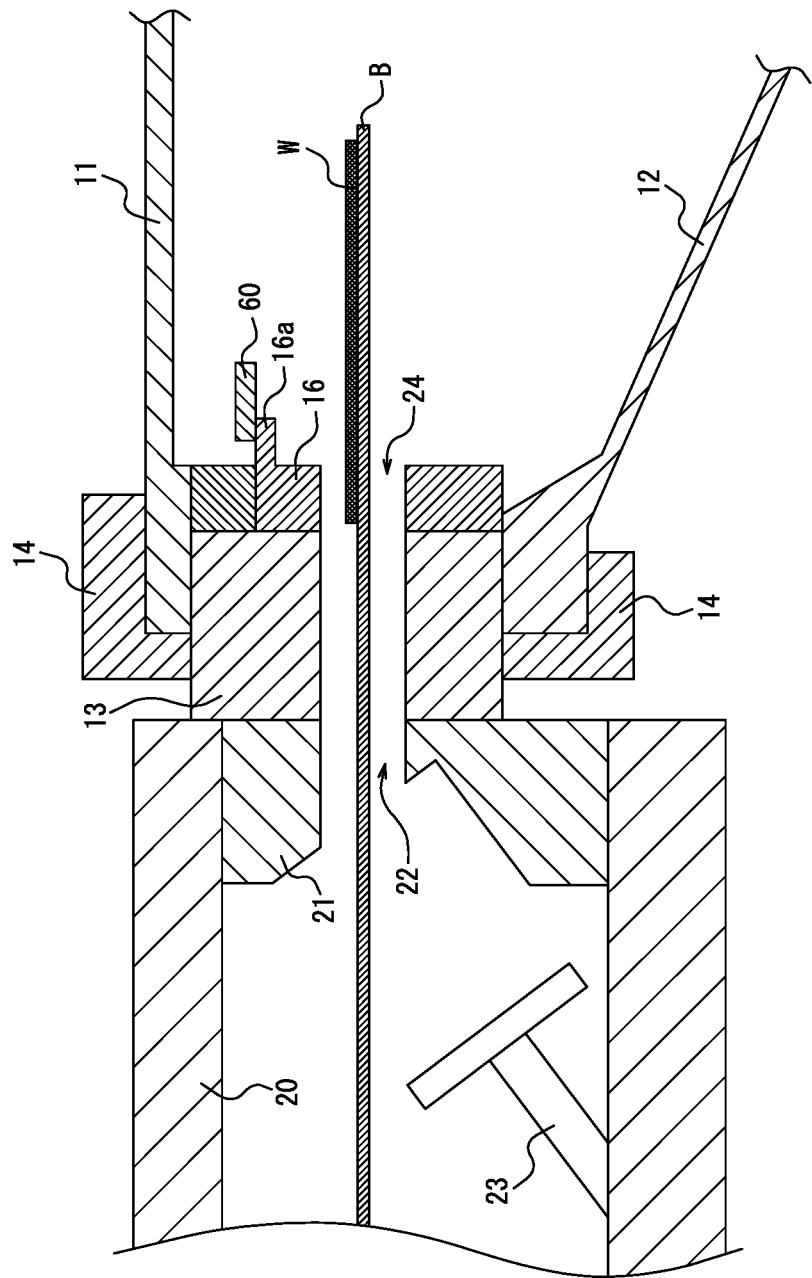
FIG. 2 is a schematic view illustrating the structure of a part of an epitaxial growth apparatus in the vicinity of a wafer loading port.
Figure 3A:
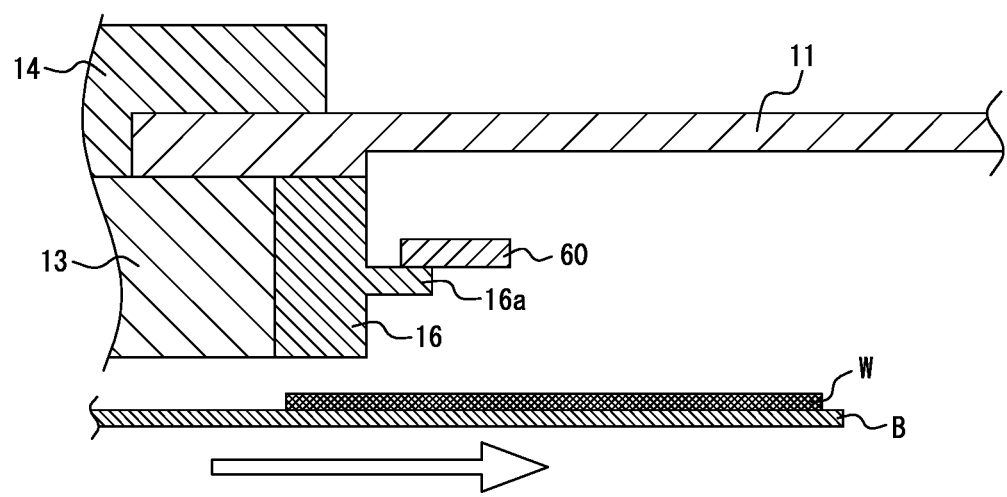
Figure 3B:
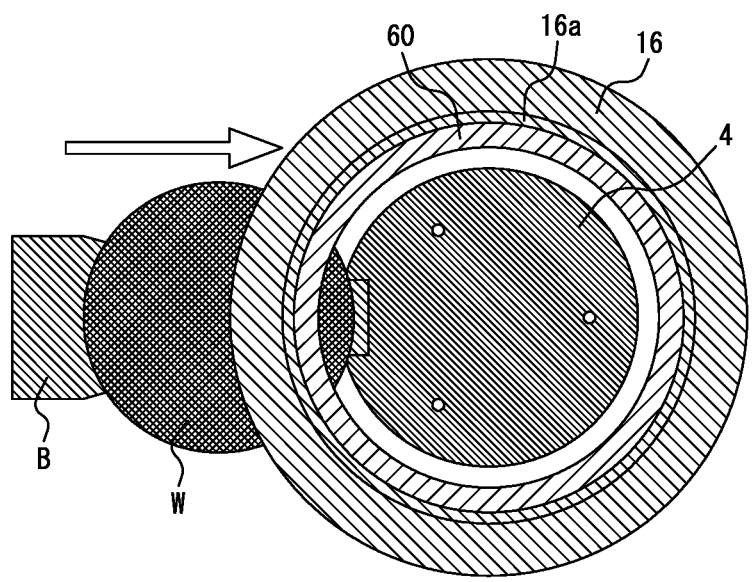

FIGS. 3A and 3B are schematic views of the structure of a part of a conventional epitaxial growth apparatus 100 around a preheat ring 60. FIG. 3A is a cross-sectional view taken along the wafer transferring direction, and FIG. 3B is a top view. As illustrated in FIG. 3A, the entire circumference of the preheat ring 60 having a ring shape is supported by a supporting portion 16a of a lower liner 16.

Further, as illustrated in FIG. 3B, a semiconductor wafer W passes below the preheat ring 60 in a transfer path in which the semiconductor wafer W is loaded through a wafer loading port 24 of the epitaxial growth apparatus 100 to be set on the susceptor 4.

Under these circumstances, when the temperature inside a chamber 10 is increased or decreased, if debris is produced due to the friction caused between the preheat ring 60 and the supporting portion 16a of the lower liner 16, particles may be deposited on the surface of the semiconductor wafer W passed below the preheat ring 60.

The inventors of this disclosure diligently studied ways to prevent the production of debris that causes the deposition of the particles between the preheat ring 60 and the supporting portion 16a of the lower liner 16. The study led them to conceive a structure in which a preheat ring 60 is not supported by a supporting portion 16a of a lower liner 16 in at least a part of a region that is right above a region where the semiconductor wafer W passes (hereinafter, may simply be referred to as "semiconductor wafer passing region") in a transfer path in which the semiconductor wafer W is loaded through a wafer loading port 24 to be set on a susceptor 4.

Figure 4A:
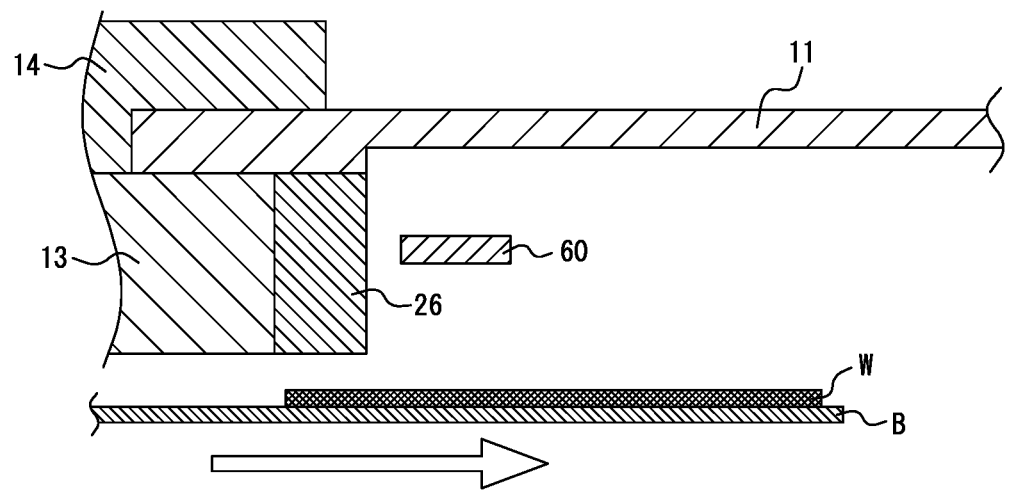
Figure 4B:
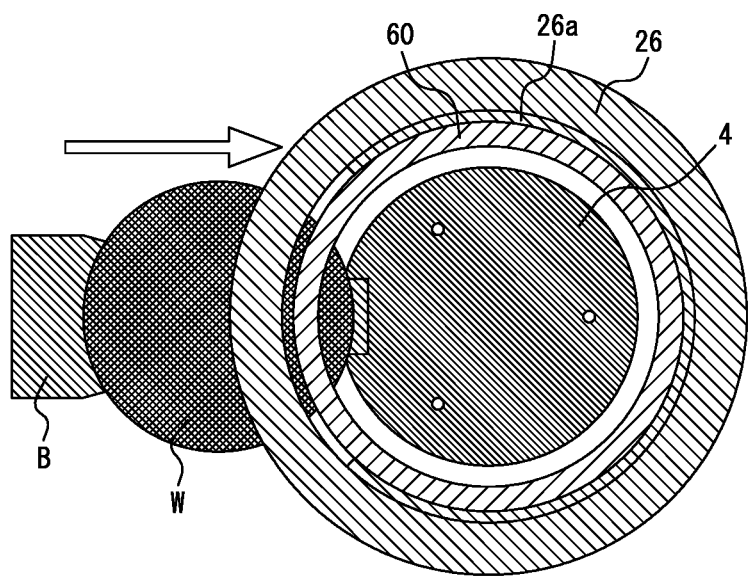

FIGS. 4A and 4B are schematic views of an example structure of a part of an epitaxial growth apparatus according to this disclosure around a preheat ring. FIG. 4A is a cross-sectional view taken along the wafer transferring direction, and FIG. 4B is a top view. In the structure depicted in FIG. 4A, a preheat ring 60 is configured not to be supported by a supporting portion 26a of a lower liner 26 in the entire region right above a semiconductor wafer W passing region.

Figure 5:
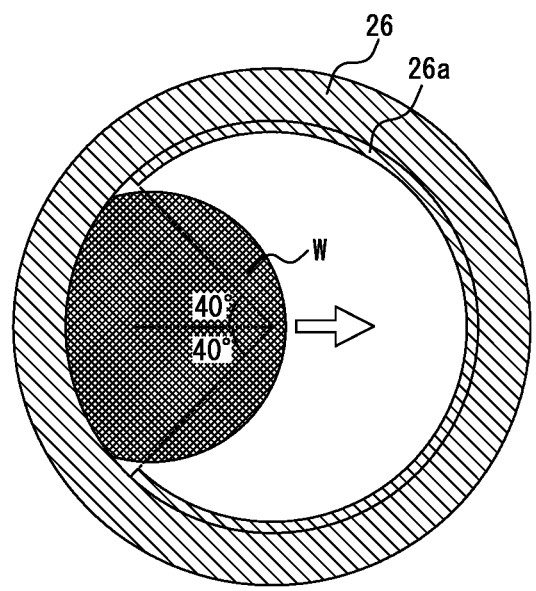
FIG. 5 is a schematic view of an example of a lower liner in an epitaxial growth device according to this disclosure.

FIG. 5 illustrates the lower liner 26 depicted in FIG. 4A. As illustrated in this diagram, for the lower liner 26, the supporting portion 26a is not provided in the entire region right above the semiconductor wafer W passing region. This prevents the production of debris between the preheat ring 60 and the supporting portion 26a of the lower liner 26 right above the semiconductor wafer W passing region. For the lower liner 26 depicted in the FIG. 5, the supporting portion 26a is not provided in a region in its entire circumference that corresponds to a central angle of ±40° with respect to the transfer direction of the semiconductor wafer W.

With the structure of the supporting portion 26a of the lower liner 26 as described above, as illustrated in FIG. 4B, debris is not produced between the preheat ring 60 and the supporting portion 26a of the lower liner 26 right above the transfer path while the semiconductor wafer W is transferred to the top of the susceptor 4, thus the deposition of particles on the surface of the semiconductor wafer W can be reduced.

When an epitaxial layer is grown on the surface of the semiconductor wafer W, if polysilicon is deposited between the preheat ring 60 and the lower liner 26, the deposited silicon would fall onto the surface of the semiconductor wafer W while the semiconductor wafer W is transferred. In this regard, the lower liner 26 depicted in FIG. 5 can prevent the deposition of the polysilicon.

For the lower liner 26 depicted in FIG. 5, the preheat ring 60 is not supported by the supporting portion 26a in the entire region right above the semiconductor wafer W passing region; alternatively, the preheat ring 60 may be configured not to be supported by the supporting portion 26a in only a part or the region.

Figure 6A:
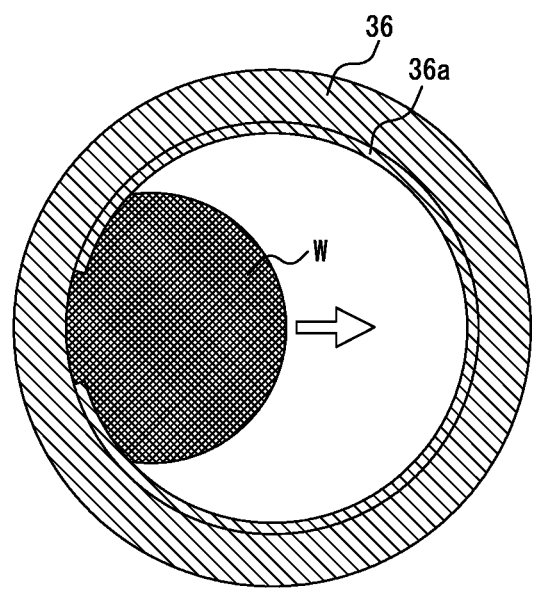
FIGS. 6A and 6B are schematic views each illustrating another example of a lower liner in an epitaxial growth device according to this disclosure.
Figure 6B:
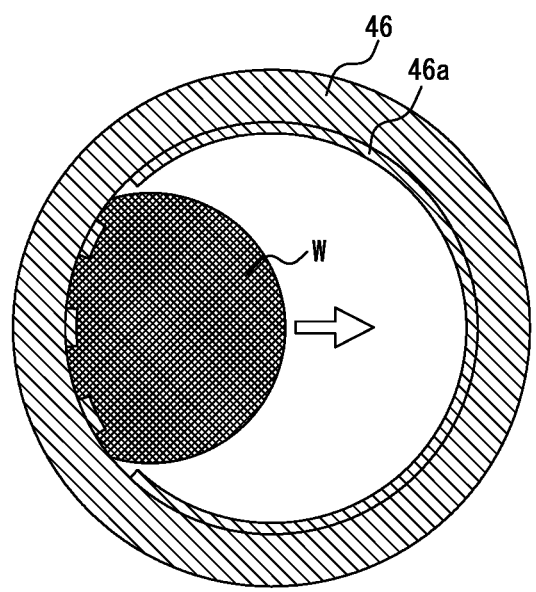

FIGS. 6A and 6B illustrate other examples of a lower liner in an epitaxial growth device according to this disclosure. For a lower liner 36 depicted in FIG. 6A, a ring-shaped supporting portion 36a is not provided only in a region in its entire circumference that corresponds to a central angle of ±15° with respect to the transfer direction of the semiconductor wafer W. Also in such a case, as compared with the case of using the conventional lower liner 16 depicted in FIGS. 3A and 3B, the production of debris between the preheat ring 60 and the lower liner 36 can be reduced, thus the deposition of particles on the surface of a semiconductor wafer W can be reduced. Further, as compared with the lower liner 26 depicted in FIG. 5, sagging (deformation) of the preheat ring 60 due to its own weight can be prevented. The above central angle is preferably ±10° to ±90°, more preferably ±10° to ±45°.

Further, for a lower liner 46 depicted in FIG. 6B, a supporting portion 46a is not provided in a region corresponding to a central angle of ±40° as in FIG. 5; however, in that region, the supporting portion 46a is partly provided. This allows the preheat ring 60 to be supported more stably as compared with the case of using the lower liner 26 depicted in FIG. 5.

For the lower liners 26, 36, and 46 depicted in FIGS. 4 to 6B, the parts of the supporting portions 26a, 36a, 46a that do not support the preheat ring 60 are completely removed when viewed from above, but are not necessarily configured in this manner.

Figure 7A:
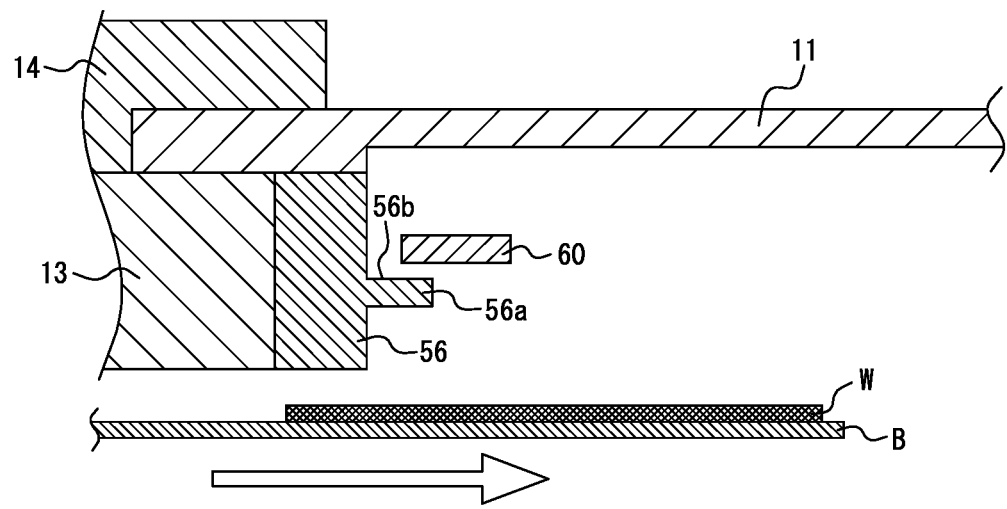
FIGS. 7A and 7B are schematic views of still another example of a lower liner in an epitaxial growth device according to this disclosure.
Figure 7B:
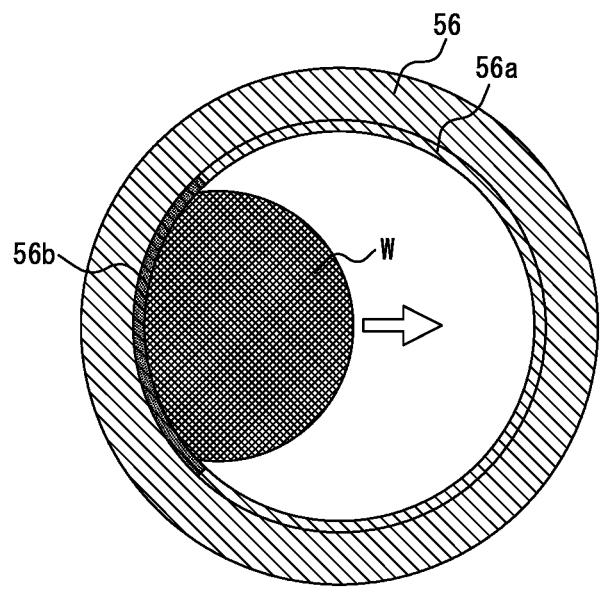

For example, as in a lower liner 56 depicted in FIGS. 7A and 7B, a recess 56b may be provided on a surface of a region of a supporting portion 56a that corresponds to a central angle of ±40° to provide a gap between the preheat ring 60 and the supporting portion 56a. Also in this case, the production of debris between the preheat ring 60 and the lower liner 56 right above a semiconductor wafer W passing region can be prevented.

Figure 8:
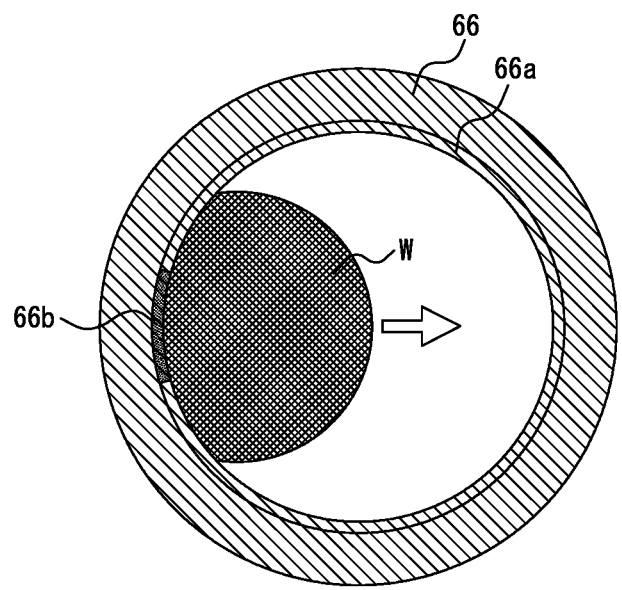
FIG. 8 is a schematic view of yet another example of a lower liner in an epitaxial growth device according to this disclosure.
Figure 9:
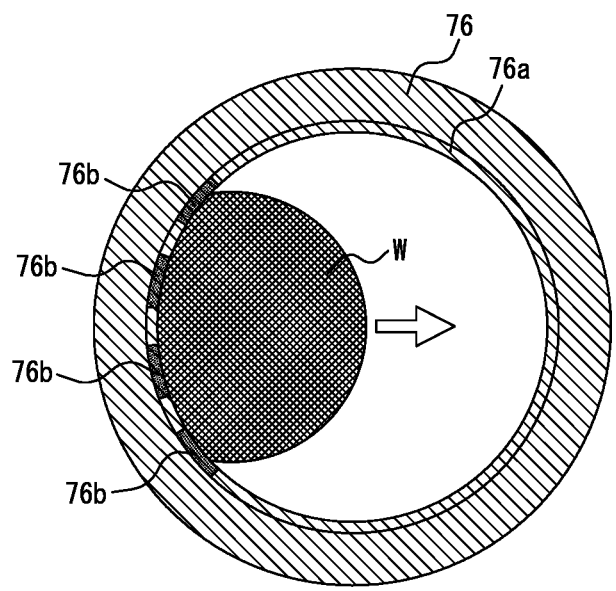
FIG. 9 is a schematic view of another example of a lower liner in an epitaxial growth device according to this disclosure.

Further, a recess(s) may be provided in the supporting portion only in a part of the region above the transfer path as in the lower liners 36 and 46 illustrated in FIGS. 6A and 6B. Specifically, for a lower liner 66 depicted in the FIG. 8, a recess 66b is provided in a region in the entire circumference of a ring-shaped supporting portion 66a that corresponds to a central angle of ±15°. Further, for a lower liner 76 depicted in FIG. 9, recesses 76b are discontinuously provided in an area corresponding to a central angle of ±40° in the supporting portion 76a as in FIGS. 7A and 7B.

Thus, with the structure in which a preheat ring is not supported by a supporting portion of a lower liner in at least a part of a region right above a semiconductor wafer passing region, the production of debris between the preheat ring and the supporting portion of the lower liner can be reduced.

As is apparent from the above description, in an epitaxial growth apparatus according to this disclosure, the supporting portion in the lower liner supporting the preheat ring has a characteristic structure, and the other structure is not limited and a conventional structure can be appropriately used.

(Method of Producing Epitaxial Wafer)

In a method of producing an epitaxial wafer, according to this disclosure, a reactant gas is supplied to any one of the epitaxial growth apparatuses according to this disclosure that have been described above to grow an epitaxial layer on a semiconductor wafer, thereby obtaining an epitaxial wafer.

As described above, in an epitaxial growth apparatus according to this disclosure, a preheat ring is not supported by a supporting portion of a lower liner in at least a part of a region right above a semiconductor wafer W passing region, thus the production of debris between the preheat ring and the lower liner can be reduced. Thus, an epitaxial wafer to which reduced particles are attached can be produced by supplying a reactant gas to the epitaxial growth apparatus according to this disclosure to form an epitaxial layer on a semiconductor wafer.

The semiconductor wafer which is a substrate of an epitaxial wafer is not limited; for example, a silicon wafer can be appropriately used, and a silicon epitaxial layer may be appropriately grown on a silicon wafer. The diameter of the semiconductor wafer may be, but not limited to, 150 mm or more, specifically 200 mm, 300 mm, 450 mm, etc.

INDUSTRIAL APPLICABILITY

According to this disclosure, the production of debris between a preheat ring and a lower liner can be prevented without fracturing the preheat ring. Consequently, the epitaxial growth apparatus and the method of producing an epitaxial wafer, according to this disclosure are useful in the semiconductor manufacturing industry.

REFERENCE SIGNS LIST

4: Susceptor
5: Lift pin
6: Elevating shaft
7: Supporting shaft
7a: Main column
7b: Supporting arm
10: Process chamber
11: Upper dome
12: Lower dome
13: Dome mounting member
14: Clamp
15: Upper liner
16, 26, 36, 46, 56, 66, 76: Lower liner
16a, 26a, 36a, 46a, 56a, 66a, 76a: Supporting portion
17: Gas inlet
18: Gas outlet
20: Transfer chamber
21: Slit member
22: Communication path
23: Slit valve
24: Wafer loading port
56b, 66b, 76b: Recess
60: Preheat ring
100: Epitaxial growth apparatus
B: Transfer blade
W: Semiconductor wafer

The invention claimed is:

1. An epitaxial growth apparatus used to vapor deposit an epitaxial layer on a surface of a semiconductor wafer, the epitaxial growth apparatus comprising:
a chamber;
an upper liner and a lower liner that have a ring shape and are disposed on an inner wall of the chamber;
a susceptor on which the semiconductor wafer is to be set, the susceptor being provided inside the chamber; and
a preheat ring that is disposed on a supporting portion protruding in an opening of the lower liner and is disposed on an outer circumference of the susceptor,
wherein the semiconductor wafer is loaded into the chamber through a wafer loading port provided on the chamber with the susceptor being lowered, and is set on the susceptor after being passed below the supporting portion of the lower liner and the preheat ring,
the preheat ring is not supported by the supporting portion in at least a part of a first region that is right above a second region where the semiconductor wafer passes in a transfer path in which the semiconductor wafer is loaded into the chamber to be set on the susceptor,
a gap is provided between the preheat ring and the supporting portion in the at least a part of the first region, and
the preheat ring has a portion at which the preheat ring is in contact with the supporting portion.

2. The epitaxial growth apparatus according to claim 1, wherein the supporting portion is not provided in the at least a part of the first region.

3. The epitaxial growth apparatus according to claim 2, wherein the at least a part of the first region is a region in an entire circumference of the supporting portion that corresponds to a central angle of 10° to 90° with respect to a direction in which the semiconductor wafer is transferred when the epitaxial growth apparatus is viewed from above.

4. The epitaxial growth apparatus according to claim 2, wherein the at least a part of the first region is the entire region of the second region.

5. A method of producing an epitaxial wafer, wherein a reactant gas is supplied to the epitaxial growth apparatus according to claim 2 to grow an epitaxial layer on a semiconductor wafer, thereby obtaining an epitaxial wafer.

6. The epitaxial growth apparatus according to any one of claim 1, wherein the at least a part of the first region is a region in an entire circumference of the supporting portion that corresponds to a central angle of 10° to 90° with respect to a direction in which the semiconductor wafer is transferred when the epitaxial growth apparatus is viewed from above.

7. The epitaxial growth apparatus according to claim 6, wherein the at least a part of the first region is the entire region of the second region.

8. A method of producing an epitaxial wafer, wherein a reactant gas is supplied to the epitaxial growth apparatus according to claim 6 to grow an epitaxial layer on a semiconductor wafer, thereby obtaining an epitaxial wafer.

9. The epitaxial growth apparatus according to any one of claim 1, wherein the at least a part of the first region is the entire region of the second region.

10. A method of producing an epitaxial wafer, wherein a reactant gas is supplied to the epitaxial growth apparatus according to claim 9 to grow an epitaxial layer on a semiconductor wafer, thereby obtaining an epitaxial wafer.

11. A method of producing an epitaxial wafer, wherein a reactant gas is supplied to the epitaxial growth apparatus according to any one of claim 1 to grow an epitaxial layer on a semiconductor wafer, thereby obtaining an epitaxial wafer.

12. The method of producing an epitaxial wafer, according to claim 11, wherein the semiconductor wafer is a silicon wafer.

* * * * *